US006763314B2

(12) United States Patent
Nigh et al.

(10) Patent No.: US 6,763,314 B2
(45) Date of Patent: Jul. 13, 2004

(54) AC DEFECT DETECTION AND FAILURE AVOIDANCE POWER UP AND DIAGNOSTIC SYSTEM

(75) Inventors: Phillip J. Nigh, Williston, VT (US); Jody J. Van Horn, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 09/967,550

(22) Filed: Sep. 28, 2001

(65) Prior Publication Data

US 2003/0065484 A1 Apr. 3, 2003

(51) Int. Cl.$^7$ ............................................... G01R 31/00
(52) U.S. Cl. ..................................... 702/117; 363/21.1
(58) Field of Search ............................... 702/57, 58, 81, 702/84, 183, 185, 117, 120; 700/121; 324/763, 765, 537; 438/14, 17, 18; 363/21.1

(56) References Cited

U.S. PATENT DOCUMENTS

| | | | | |
|---|---|---|---|---|
| 4,811,343 A | * | 3/1989 | Johansson et al. | 714/55 |
| 4,931,742 A | | 6/1990 | Karash et al. | 324/541 |
| 5,381,373 A | | 1/1995 | Ohsawa | 365/201 |
| 5,450,417 A | | 9/1995 | Truong et al. | 714/724 |
| 5,463,559 A | | 10/1995 | Kirkpatrick et al. | 702/58 |
| 5,523,977 A | | 6/1996 | Tobita et al. | 365/201 |
| 6,028,798 A | | 2/2000 | Roohparvar | 365/201 |
| 6,088,819 A | | 7/2000 | Adachi et al. | 714/718 |
| 6,105,152 A | | 8/2000 | Duesman et al. | 714/718 |
| 6,434,025 B2 | * | 8/2002 | Shirai et al. | 363/21.1 |
| 6,476,631 B1 | * | 11/2002 | Madge | 324/765 |

FOREIGN PATENT DOCUMENTS

JP          9-93791          4/1997

OTHER PUBLICATIONS

Franco et al., "An Experimental Chip to Evaluate Test Techniques: Chip and Experiment Design", 1995, Proc. of the International Test Conference, pp. 653–662.*

Franco et al., "An Experimental Chip to Evaluate Test Techniques: Experiment Results", 1995, Proc. of the International Test Conference, pp. 663–672.*

McCluskey et al., "Stuck–Fault Tests vs. Actual Defects", IEEE International Test Conference, 2000, pp. 336–343.*

Chang et al., "Detecting Delay Flaws by Very–Low–Voltage Testing", IEEE International Test Conference, 1996, pp. 367–376.*

Hao et al., "Very–Low–Voltage Testing for Weak CMOS Logic ICs", IEEE ITC, 1993, pp. 275–284.*

Li et al., "Diagnosis of Tunneling Opens", IEEE ITC, Mar. 29–Apr. 3, 2001, pp. 22–27.*

Li et al. "Testing for Tunneling Opens", IEEE ITC, 2000, pp. 85–94.*

\* cited by examiner

Primary Examiner—Marc S. Hoff
Assistant Examiner—Mohamed Charioui
(74) Attorney, Agent, or Firm—McGinn & Gibb, PLLC; Robert A. Walsh, Esq.

(57) ABSTRACT

A system for modifying the power up and diagnostic procedure of systems such that the system voltage is lowered to a predetermined voltage level that has been shown to detect delay faults. The system conducts the normal procedure of power up/diagnostic routines at the described VLV condition and then logs failures to this VLV condition. Upon completion of the VLV power up, the system is shut down normally and then subsequently powered up again at the normal voltage conditions. Discrepancies between the VLV power up/diagnostics are noted in the system log and communicated appropriately.

16 Claims, 1 Drawing Sheet

AC DEFECT DETECTION AND FAILURE AVOIDANCE POWER UP AND DIAGNOSTIC SYSTEM

BACKGROUND OF THE INVENTION

1. Field of the Invention

The present invention generally relates to integrated circuit devices, and more particularly to an AC defect detection and failure avoidance power up and diagnostic system.

2. Description of the Related Art

Relentless market demands have spawned unprecedented advancements in technology and catapulted technology suppliers into the realm of GHz processors, exponential number of transistors, revolutionary materials and deep submicron dimensions. As a result, the task before the testing and reliability engineer is daunting to say the least. Defects, which were and could be previously ignored, are now catastrophic in increasing frequency.

Insatiable performance and function require picosecond accuracy and miles of wiring per chip. In fact, six to eight wiring levels are common in the industry, resulting in an explosion of vias and contacts per chip. Conversely, smaller chip sizes dictate smaller via diameters while GHz speeds rely on constant dielectric thicknesses. All of this results in profound increases in via aspect ratios, thereby making vias one of the most difficult structures to fabricate. Hence, the defect mix is shifting to a greater percentage of resistive defects (opens). Data demonstrates that resistive defects are much more difficult to detect and even more difficult to stress.

Furthermore, ominous trends in test data, reliability modeling, and limitations in application methodology do not bode well for maintaining customer expectations in the quality and reliability of deep submicron semiconductor products in the imminent future.

In fact, advancements in deep submicron silicon manufacturing processes are enabling a doubling of chip performance every 12–18 months, which has manifested itself in processor speeds in excess of 1 GHz. At these frequencies, defects causing picosecond degradation, which were previously ignored in prior generations of systems, are increasingly causing system errors and malfunctions in the field to the point where today "AC/delay defects" are the primary cause of card/system/field quality problems. It has been shown that running test patterns on integrated circuits (ICs) at Very Low Voltage (VLV) has been successful in detecting a percentage of these high speed delay faults during the normal manufacturing test of the ICs. Additionally, data also shows that defects detected through the application of VLV testing have a higher probability of becoming a reliability failure. It has also been found that other types of resistive opens and resistive shorts can be detected using VLV testing. Currently, there is no known solution for system level AC defect detection and failure avoidance diagnostics. Therefore, there is a need for a new and improved diagnostic system that identifies resistive defects prior to machine failure.

SUMMARY OF THE INVENTION

In view of the foregoing and other problems, disadvantages, and drawbacks of the conventional diagnostic systems, the present invention has been devised, and it is an object of the present invention to allows system suppliers to detect and identify subtle resistive defects before they manifest themselves as machine failures.

In order to attain the object suggested above, there is provided, according to one aspect of the invention a method for detecting AC defects and enabling failure avoidance in a system comprising the steps of first, lowering a system voltage to a predetermined voltage level. Second, the system is powered up. Third, diagnostic routines are performed. Next, failures of the lower operating voltage conditions are logged into the system. Then, the system is powered down. After which, the system voltage is raised to a normal operating voltage. Thereupon, the system is powered up at a normal operating voltage. Next, discrepancies between the failures of the lower operating voltage conditions and normal operating voltage conditions are logged, and finally, the logging discrepancies between the failures of the lower operating voltage conditions and normal operating voltage conditions are compared and analyzed. The predetermined voltage level is capable of detecting delay faults. Moreover, the predetermined voltage level is at the very low voltage level.

Although AC or timing-related defects are the best known class of failures detectable with VLV testing, there are other types of defects that have also been found to be detectable with VLV testing. For example, resistive opens and resistive shorts, improperly doped implants, and transistor leakage defects are detectable by VLV testing; even before these defects cause a hard system failure. These are defects types which also may degrade during system operation and become a reliability failure. Thus, VLV testing can detect a wide class of defects that initial cause only marginal performance behavior or differences, but which later may become hard system failures.

Again, there are no known solutions for system level AC defect detection and failure avoidance diagnostics, especially for systems at the chip performance and processor speed levels currently used and being developed. Therefore, the present invention solves the need for a diagnostic system that identifies resistive defects prior to machine failure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As previously mentioned, there is a need for an improved system routine for system level AC defect detection and failure avoidance diagnostics. Among other features, one of the novel aspects of this invention is to modify the power up and diagnostic procedure of systems such that the system voltage is lowered to a predetermined voltage level that has been shown to detect delay faults. The system then conducts the normal procedure of power up/diagnostic routines at the described VLV condition and then logs failures to this VLV condition. Upon completion of the VLV power up, the system is shut down normally and then subsequently powered up again at the normal voltage conditions. Discrepancies between the VLV power up/diagnostics are noted in the system log and communicated appropriately.

The present invention demonstrates that a resistive defect is more easily detected at a lower operating voltage simply due to the current limiting nature of the defect. Accordingly, at a lower voltage, the current is limited to the point of inoperability of the device or system. Typically, the testing is accomplished at +/−10% of the normal power supply value. In VLV testing, the power supply level is reduced to 60% to 75% of the normal operating voltage.

The present invention is applicable to manufacturing testing of both components and systems. The VLV diagnostic sequence disclosed is in addition to the power up routine of the finished product or system, hence enabling an avoidance of a future system failure due to a further degradation of a latent defect that is detectable prior to failure only at VLV conditions.

The invention solves the growing problem of AC/delay related system failures by adapting and applying a technique at the chip/IC level to system level testing. Moreover, this invention enables the field service and system suppliers to anticipate and diagnose failures before they occur, hence allowing "at risk" FRU (Field Replacement Unit) or component replacement to occur during normal maintenance.

Figure 2:
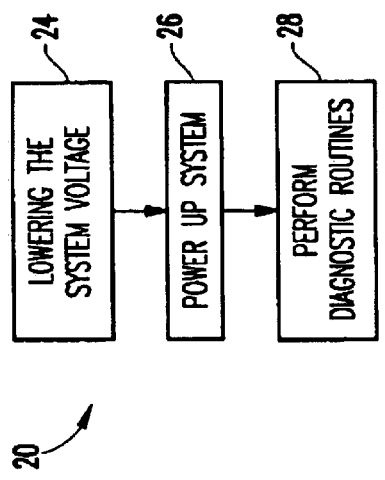
FIG. 2 is a schematic flow diagram of a diagnostic system according to the present invention.
Figure 1:
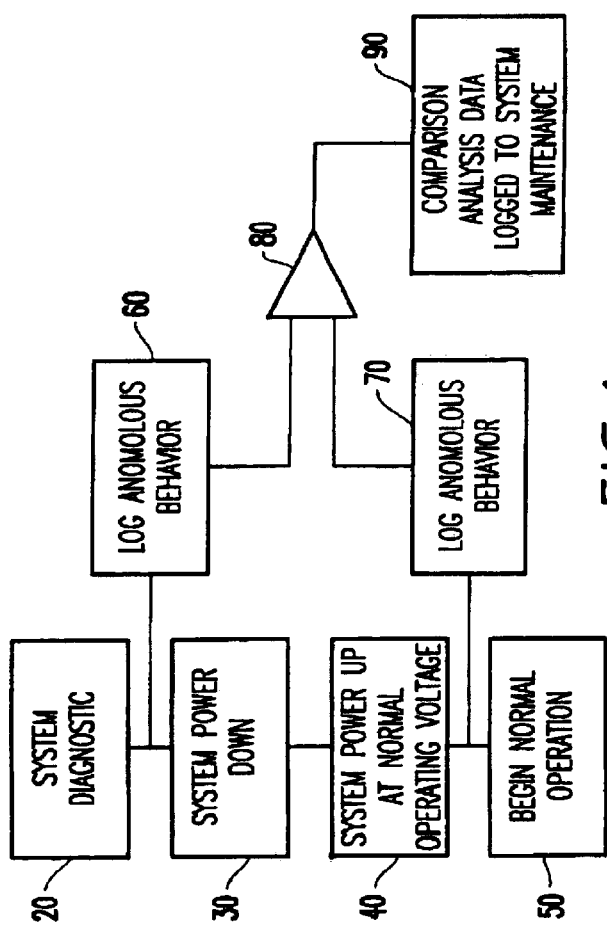
FIG. 1 is a schematic flow diagram of a diagnostic system according to the present invention.

Referring now to the drawings, and more particularly to FIG. 1, there are shown preferred embodiments of the method and structures according to the present invention. In FIG. 1, a system level AC defect detection and failure avoidance system 10 is shown in the mode of an AC defect power up screen. Here, the system 10 comprises performing a system diagnostic 20, which is further detailed in FIG. 2. The system diagnostic 20 comprises lowering 24 the system voltage to a predetermined voltage level that has been shown to detect delay faults. Next, the system 10 is powered up 26, and then conducts 28 the normal procedure of diagnostic routines at the described VLV condition.

The remaining steps of the procedure are shown in FIG. 1, whereby after the system performs its diagnostic step 20, the system 10 then logs 60 failures to the VLV condition. Upon completion of the VLV diagnostic step 20 (lowering voltage 24, power up 26, and diagnostic routines 28), the system is shut down 30 normally and then subsequently powered up again 40 at the normal voltage conditions. Discrepancies between the VLV power up/diagnostics are noted 70 in the system log. After which, two simultaneous steps occur, wherein the normal operation of the computer begins 50, whereby the discrepancies between the VLV power/up diagnostics are compared 80, and the comparison analysis data is logged 90 into the system maintenance.

Figure 3:
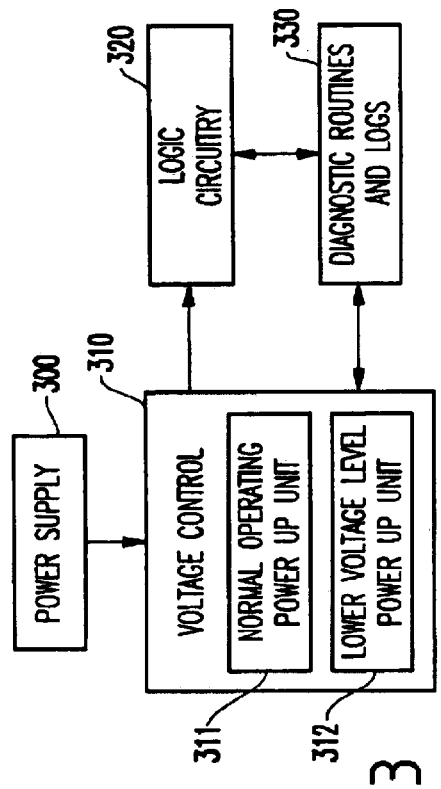
FIG. 3 is a schematic flow diagram of a diagnostic system according to the present invention.

In FIG. 3, the system diagnostic is shown comprising a power source supply 300, which provides power to the voltage control 310. The voltage control 310 further comprises a normal operating voltage power up unit 311 and a lower level (VLV) power up unit 312. The logic circuitry 320 receives power from the power supply 300 through the voltage control 310. Diagnostic routines 330 including logging results occurs as the dual voltage power up diagnosis occurs. The results are fed back into the logic circuitry 320 and the voltage control 310, wherein the voltage control 310 includes the power up controller that performs the dual voltage power up comprising the lower level power up 312 and the second normal level power up 311.

As mentioned, the invention solves the growing problem of AC/delay related system failures by adapting and applying a technique at the chip/IC level to system level testing. Moreover, this invention enables the field service and system suppliers to anticipate and diagnose failures before they occur, hence allowing "at risk" FRU or component replacement to occur during normal maintenance.

There are several benefits of the present invention, most notably, the avoidance of future system failures through early detection enabled by VLV levels. Moreover, the present invention enables a potentially defective FRU to be replaced during normal preventive maintenance, thereby avoiding future, and more expensive, maintenance costs. Furthermore, there are several applications which would benefit from the present invention. These applications span the spectrum of electronic systems from consumer electronics and games to rather complex systems such as web servers and mainframes.

While the invention has been described in terms of preferred embodiments, those skilled in the art will recognize that the invention can be practiced with modification within the spirit and scope of the appended claims.

What is claimed is:

1. A method for detecting system level AC defects causing marginal circuit behavior and enabling failure avoidance in a system, said method comprising:
   powering up said system at a predetermined voltage level below a normal operating voltage;
   performing diagnostic routines on said system operating at said predetermined voltage level;
   detecting system level AC delay faults in said system at said predetermined voltage level;
   logging failures of operating conditions at said predetermined voltage level;
   identifying system components causing said failures; and
   preventing future system failures from occurring by performing preventive maintenance on the failure-causing system components.

2. The method of claim 1, further comprising:
   powering down said system after the step of logging failures;
   powering up said system at said normal operating voltage level;
   detecting system level AC delay faults in said system at said normal operating voltage level;
   logging failures of operating conditions at said normal operating voltage level; and logging discrepancies between said failures of operating conditions at said predetermined voltage level and said failures of operating conditions at said normal operating voltage level.

3. The method of claim 2, further comprising:
   generating comparison analysis data, wherein said comparison analysis data comprises the logged discrepancies between said failures of operating conditions at said predetermined voltage level and said failures of operating conditions at said normal operating voltage level.

4. The method of claim 3, Further comprising logging said comparison analysis data into a system maintenance component of said system for diagnosing said failures during manufacturing of said system.

5. The method of claim 2, wherein a greater number of system level AC delay faults are detected at said predetermined voltage level than at said normal operating voltage level.

6. The method of claim 1, wherein said predetermined voltage level is approximately in the range of 40% to 75% of said normal operating voltage level.

7. A program storage device readable by machine, tangibly embodying a program of instructions executable by the machine to perform a method for detecting system level AC defects causing marginal circuit behavior and enabling failure avoidance in a system, said method comprising:

power up said system at a predetermined voltage level below a normal operating voltage;

performing diagnostic routines on said system operating at said predetermined voltage level;

detecting system level AC delay faults in said system at said predetermined voltage level;

logging failures of operating conditions at said predetermined voltage level;

identifying system components causing said failures; and preventing future system failures from occurring by performing preventive maintenance on the failure-causing system components.

8. The program storage device of claim 7, wherein said method further comprises:

powering down said system after said step or logging failures;

raising said system voltage to said normal operating voltage level;

powering up said system at said normal operating voltage level;

detecting system level AC delay faults in said system at said normal operating voltage level;

logging failures of operating conditions at said normal operating voltage level; and logging discrepancies between said failures of operating conditions at said predetermined voltage level and said failures of operating conditions at said normal operating voltage level.

9. The program storage device of claim 8, wherein said method further comprises:

generating comparison analysis data, wherein said comparison analysis data comprises the logged discrepancies between said failures of operating conditions at said predetermined voltage level and said failures of operating conditions at said normal operating voltage level.

10. The program storage device of claim 9, wherein said method further comprises logging said comparison analysis data into a system maintenance component of said system for diagnosing said failers during manufacturing of said system.

11. The program storage device of claim 8, wherein a greater number of system level AC delay faults are detected at said predetermined voltage level than at said normal operating voltage level.

12. The program storage device of claim 7, wherein said predetermined voltage level is approximately in the range of 60% to 75% of said normal operating voltage level.

13. A control system for an integrated circuit chip, said system comprising:

a power source;

a voltage control connected to said power source;

logic circuitry receiving power from said power source, wherein said voltage control includes a power up controller that performs a dual voltage power up comprising a first power up and diagnosis at a first voltage level and a second power up and diagnosis at a second voltage level, wherein said second voltage level is higher than said first voltage level; and wherein said power up controller is operable to detect and compare system level AC delay faults at said first voltage level and at said second voltage level; and a system log operable to maintain comparison analysis data of said level AC delay faults at said first voltage level and at said second voltage level, wherein said system log identifies system components causing said system level AC delay faults in order to prevent future system failures from occurring.

14. The system in claim 13, wherein said second voltage level is a normal operating voltage level of said logic circuitry.

15. The system in claim 13, wherein more system level AC delay faults are detected at said first voltage level than at said second voltage level.

16. The system in claim 13, wherein said first voltage level is approximately in the range of 60% to 75% of said second voltage level.

* * * * *